United States Patent [19]
Anderson

[11] Patent Number: 5,311,468
[45] Date of Patent: May 10, 1994

[54] RANDOM ACCESS MEMORY WITH A SERIAL REGISTER ARRANGED FOR QUICK ACCESS OF A SECOND BIT FROM AN ARBITRARY ADDRESS

[75] Inventor: Daniel F. Anderson, Missouri City, Tex.

[73] Assignee: Texas Instruments Incorporated, Dallas, Tex.

[21] Appl. No.: 672,806

[22] Filed: Mar. 21, 1991

[51] Int. Cl.[5] .............................................. G11C 7/00
[52] U.S. Cl. ........................ 365/189.02; 365/189.12; 365/230.04; 365/221; 365/240
[58] Field of Search .................... 365/49, 221, 230.04, 365/230.02, 189.02, 189.12, 240

[56] References Cited

U.S. PATENT DOCUMENTS

| | | | |
|---|---|---|---|
| 4,281,401 | 7/1989 | Redwine et al. | 365/222 |
| 4,639,890 | 12/1987 | Heilveil et al. | 364/990 |
| 4,747,081 | 5/1988 | Heilveil et al. | 365/219 |

*Primary Examiner*—Joseph E. Clawson, Jr.
*Attorney, Agent, or Firm*—Richard B. Havill; Richard L. Donaldson

[57] ABSTRACT

A random access memory includes a memory array of storage cells arranged in addressable rows and columns. A serial register is coupled to the memory array and to a serial register address decoder. A serial counter generates and applies to the serial register address decoder a sequence of addresses starting with an initial tap address. In response to the initial tap address, a first data bit is read out of an addressed storage cell of the memory array and is applied to a first input of a multiplexer. The initial tap address either is passed to the serial register address decoder or is incremented and applied to the serial register addressed decoder for accessing a second data bit from the serial register to a multiplexer. The initial tap address is incremented before passage only if the least significant bit of the initial address is odd.

9 Claims, 5 Drawing Sheets

RANDOM ACCESS MEMORY WITH A SERIAL REGISTER ARRANGED FOR QUICK ACCESS OF A SECOND BIT FROM AN ARBITRARY ADDRESS

RELATED CASES

This application contains subject matter disclosed in copending applications Ser. No. 821,641 (TI-09484), filed Jan. 23, 1986; Ser. No. 387,569 (TI-14315), filed Jul. 28, 1989; Ser. No. 563,469 (TI-14755), filed Aug. 6, 1990; Ser. No. 563,471 (TI-15211), filed Aug. 6, 1990; and in the U.S. Pat. Nos. 4,281,401, 4,639,890, and 4,747,081. The above mentioned applications and patents are incorporated herein by reference.

BACKGROUND OF INVENTION

1. Field of Invention

The present invention pertains to data processing systems, generally, and more particularly to data processing systems using a very fast access semiconductor memory array.

2. Description of the Related Art

In the prior art, data processing systems transfer an entire row of data bits from a dynamic random access memory into a serial register for readout. From the serial register, the entire row of data bits may be read out in a serial sequence. We know that this operation puts limits on the speed of some data processing systems.

In order to improve the speed of access of the first bit of a serial readout operation of a random access memory, the initial tap (column) address is latched into a register for accessing the selected first bit directly from the memory array rather than from the serial register. The selected initial bit is transmitted through a first data line from the array directly to a first input of a multiplexer. Subsequent bits are transmitted from taps associated with the sequential stages of the serial register. Addressing the stages of the serial register is accomplished by presetting a tap address counter to a count state equivalent to the initial tap address and incrementing that count state in response to the readout clock.

Address decoding is designed to enable simultaneous readout from pairs of adjacent serial register stages. The two bits of information (one from an odd column address and one from an even column address) are transmitted through separate leads, each associated with a different input to an odd/even multiplexer, or selector. The least significant bit of the tap address determines whether the bit from the odd column address or the bit from the even column address is transmitted through the multiplexer.

When the initial tap address is an even number, the first and second bits are accessed very rapidly. The first bit is accessed directly from the memory array, as previously described. The second bit is accessed from an addressed tap of the serial register. That tap is previously addressed because of the paired adjacent stages of the serial register addressing scheme, as previously described. As soon as the least significant bit of the tap address counter is incremented, the second bit is transmitted through the odd/even multiplexer.

A problem arises, however, when the initial tap address is an odd number. The first bit is accessed very rapidly directly from the memory array, again as previously described. Access of the second bit is much slower under these circumstances because when the tap address is incremented, the incremented count must ripple through at least first and second stages of the tap address counter, some interconnecting leads, and the decoder circuitry before the second tap address is valid. The delay caused by the ripple through increment addressing of the second tap is sufficiently long that the operating speed of some data processing systems must be reduced to wait for data being read out of the memory.

SUMMARY OF INVENTION

These and other problems are solved by a data processing system including an array of a random access memory with a serial register having an associated initial tap address register. The random access memory includes a memory array of storage cells arranged in addressable rows and columns. The serial register is coupled to the memory array and to a serial register address decoder. To commence a serial readout operation, the address of the initial tap of the serial register is loaded into an initial tap address register. That information determines the initial tap address for an access operation to the serial register. A serial counter generates and applies to the serial register address decoder a sequence of addresses starting with an initial tap address. In response to the initial tap address, a first data bit is read out directly from an addressed storage cell of the memory array and is applied to a first input of a multiplexer. The initial tap address either is passed to the serial register address decoder or is incremented and then applied to the serial register address decoder for accessing a second data bit from the serial register. This second data bit already is applied to a second input of the multiplexer. The initial tap address is conditionally incremented before it is passed, i.e., it is incremented only if the least significant bit of the initial tap address is an odd value. The first and second bits are selected for transmission through the multiplexer by the state of the least significant bit existing in the serial counter.

There is an operational advantage for the data processing system quickly accessing the second addressed storage element, when the first storage element has an odd address in the serial register. The data processing system operates at a faster speed.

BRIEF DESCRIPTION OF THE DRAWINGS

A more complete understanding of the invention may be gained by reading the following detailed description with reference to the drawing wherein.

DETAILED DESCRIPTION

Figure 1:
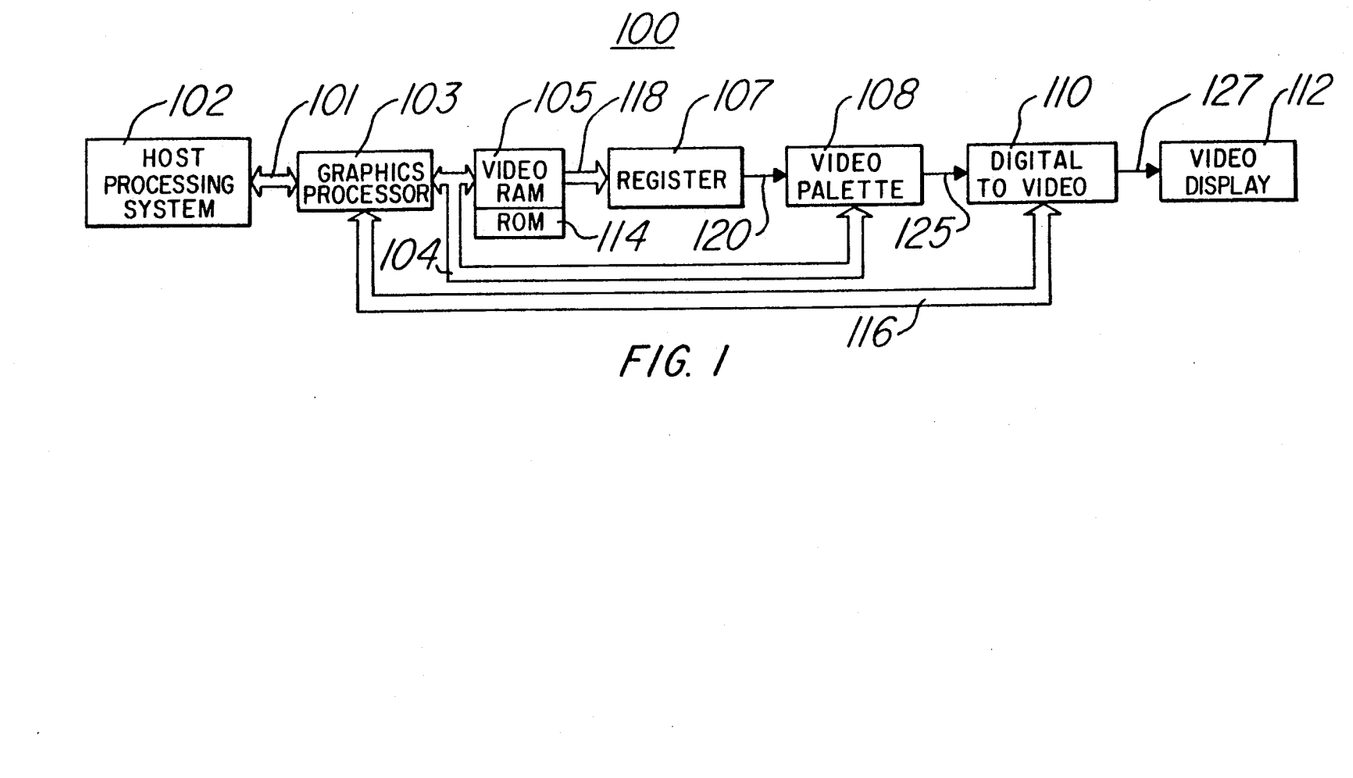
FIG. 1 is a block diagram of part of a data processing system.

Referring now to FIG. 1, there is shown a block diagram of a data processing system 100 including a graphics display arrangement for presenting information. A more complete description of the arrangement and operation of the system of FIG. 1 can be found in the previously mentioned patent application Ser. No. 821,641.

The data processing system 100 includes a host processing system 102, a graphics processor 103, such as a Texas Instruments TMS34010 or TMS34020 Graphics System Processor, a video random access memory 105, a data register 107, a video palette 108, a digital to video converter 110, and a video display 112.

Host processing system 102 provides the major computational capacity for the data processing system 100. Included in the host processing system 102 are a processor, an input device, a long term storage device, a read only memory, a random access memory and assorted peripheral devices that form a computer system. Arrangement and operation of the host processing system are considered to be conventional. As a result of its processing functions, the host processing system 102 determines the information content of the graphic display to be presented on a screen for the user.

Graphics processor 103 provides the major portion of data manipulation for producing the particular graphics display to be presented on the screen. The graphics processor 103 is bidirectionally coupled to the host processing system 102 by way of a host bus 101. In the arrangement of FIG. 1, graphics processor 103 operates independently from the host processing system 102. The graphics processor 103, however, is responsive to requests from the host processing system 102. Graphics processor 103 also communicates with memory 105 and the video palette 108 by way of a memory bus 104. Data to be stored in the video random access memory 105 is controlled by the graphics processor 103. The graphics processor, in turn, may be controlled either in part or wholly by a program stored in a read only memory 114. Read only memory 114 may also store various types of graphic image data.

Additionally the graphics processor 103 controls data stored within the video palette 108 and, by way of a video control bus 116, the operation of the digital to video converter 110. Through the digital to video converter, the graphics processor 103 can control the line length and the number of lines per frame of the video graphic image. Significantly, the graphics processor 103 determines and controls where graphic display information is stored in the video random access memory 105. Subsequently, during readout from the video random access memory 105, the graphics processor determines the readout sequence from the video random access memory and the data register 107, the addresses to be accessed, and control information required to produce the desired graphic image on the display 112.

Video random access memory 105 stores the bit mapped graphics data which define the graphics image to be presented to the user. Control of the transfer of the data from the video random access memory 105 through the data register 107, the video palette 108, and the digital to video converter 110 to the display 112 is provided by the graphics processor 103. Video data output from the video random access memory 105 is transferred by way of a video output bus 118 to the data register 107 where it is assembled into a display bit stream. The data register 107 may be a shift register.

Storage elements of the data register 107 may be fabricated in MOS or bipolar integrated circuit technology as either dynamic or static electronic circuits. Alternative choices of storage elements include any bistable electronic, magnetic, optical, or optoelectronic device with sufficient operating speed.

In accordance with a typical arrangement of the video random access memory 105, there is a bank of several separate random access memory integrated circuits. Storage cells of the video random access memory 105 may be fabricated in MOS or bipolar semiconductor technology as either dynamic or static electronic circuits. Typically the storage cells are dynamic and are fabricated as an NMOS arrangement. For a single random access readout operation for the graphics processor, only one bit of data is readout from a selected storage element of each of the integrated circuits. Thus a group of bits, including one bit from each of the several separate integrated circuits, are read out at once. For a serial data readout operation, an entire row of data is transferred at once from the memory 105 through transfer gates to a serial register. From the serial register it is transmitted sequentially to the data register 107. The data register 107 assembles the display bit stream for transmission by way of a lead 120 to the video palette 108. Although the foregoing describes the video random access memory 105 as an electronic circuit, the invention may also be carried out by a memory fabricated as any bistable electronic, magnetic, optical or optoelectronic device with sufficient speed.

Under control of information from the graphics processor 103, the video palette 108, such as a Texas Instruments TMS34070 Video Palette, converts the data received from the data register 107 into video level signals on a bus 125. This conversion is accomplished through a look-up table. The video level signal output from the video palette 108 may include color, saturation, and brightness information.

Digital to video converter 110 receives the digital video signals from the video palette 108 and, under control of signals received by way of the video control bus 116, converts the digital video signals into analog levels which are applied to the video display 112 via an output line 127. The number of pixels per horizontal line and the number of lines per display are determined by the graphics processor 103. Also, the synchronization, retrace, and blanking signals are controlled by the graphics processor 103. Altogether, this group of signals specify the desired video output to the video display 112.

Video display 112 produces the specified video image for viewing by the user. There are two techniques which are used widely. The first technique specifies video data in terms of color, hue, brightness, and saturation for each pixel. For the second technique, color levels of red, blue and green are specified for each pixel. The video palette 108, the digital to video converter 110, and the video display are designed and fabricated to be compatible with the selected technique.

Figure 2:
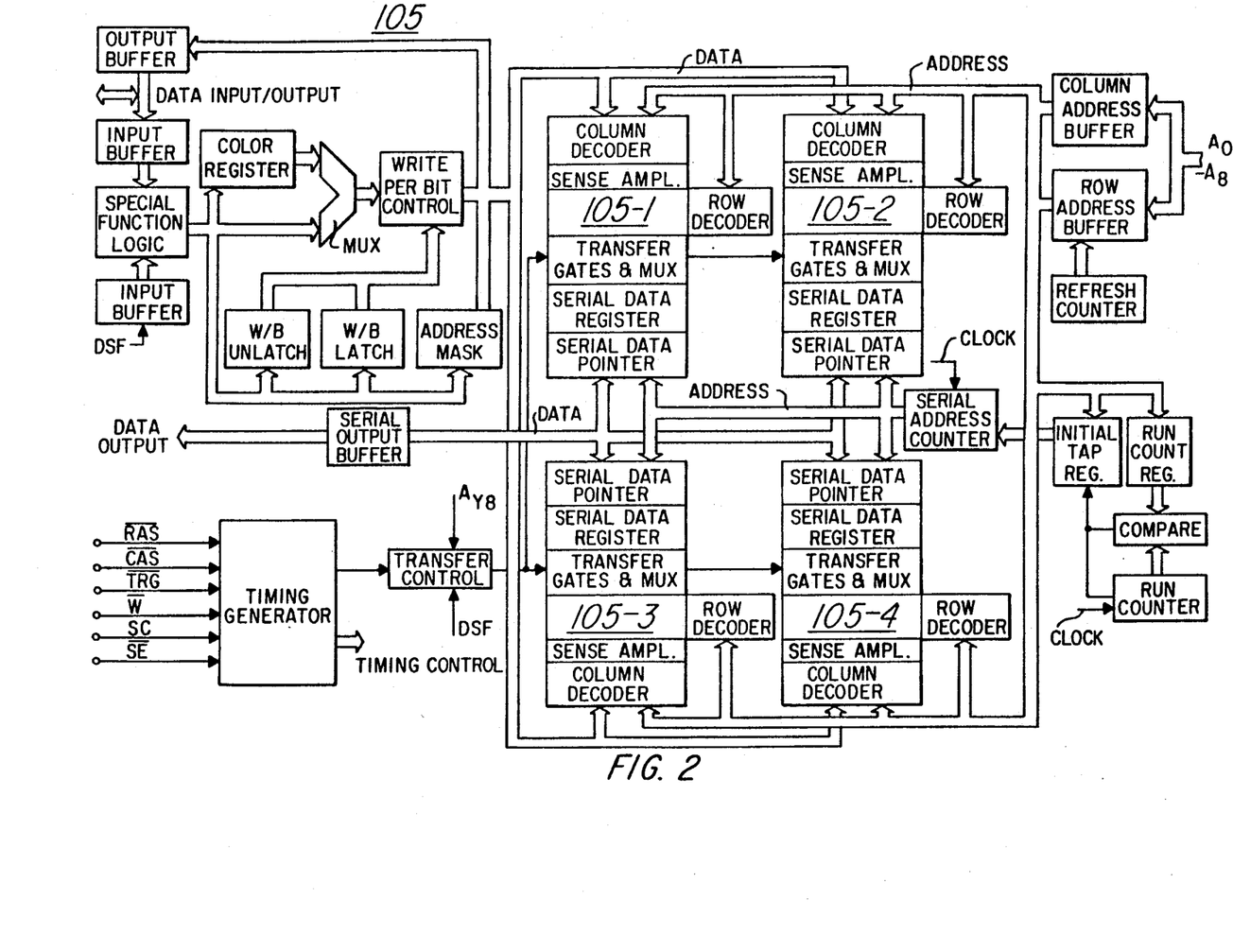
FIG. 2 is a block diagram of circuits included in a random access memory integrated circuit chip.

Referring now to FIG. 2, there is shown a block diagram layout of an integrated circuit video random access memory 105. Included within the memory 105 are four arrays of memory cells 105-1, 105-2, 105-3, 105-4. The cells are arranged in addressable rows and columns and typically are fabricated as dynamic NMOS circuits. For random access, row and column addresses are applied to the integrated circuit by way of address leads and an address bus. For random access, row and column addresses are decoded respectively by row and column decoders. Data is written from a data bus through the column decoders and sense amplifiers to the selected cells of the memory arrays. For serial readout, the data is read from a selected row of the memory arrays, by way of bit lines to and through transfer gates to the serial registers. A serial address counter applies a series of serial data register addresses to the serial data pointers, or decoder. In response to those addresses, sequences of data are transmitted from the serial registers through a data bus to a serial output buffer. From there the data proceeds to the data register 107, the video palette, the digital-to-video signal converter, and to the video display, as shown in FIG. 1. Circuits, shown as peripheral to the arrays of memory cells 105-1, 105-2, 105-3 and 105-4, typically are fabricated as static CMOS or BICMOS circuits. Dynamic NMOS circuits also may be used.

In the arrangement of FIG. 2, the various random access input and output circuits are replicated four times to complete the random access arrangement.

For serial output operation, a group of common circuits controls the readout operation very effectively. The group of circuits includes an initial tap register, a run count register, a run counter, a comparator, and a serial address counter which applies a series of addresses through another address bus to serial data pointers associated with each serial data register. Operation of these common circuits for serial readout are described at length hereinafter.

Figure 3:
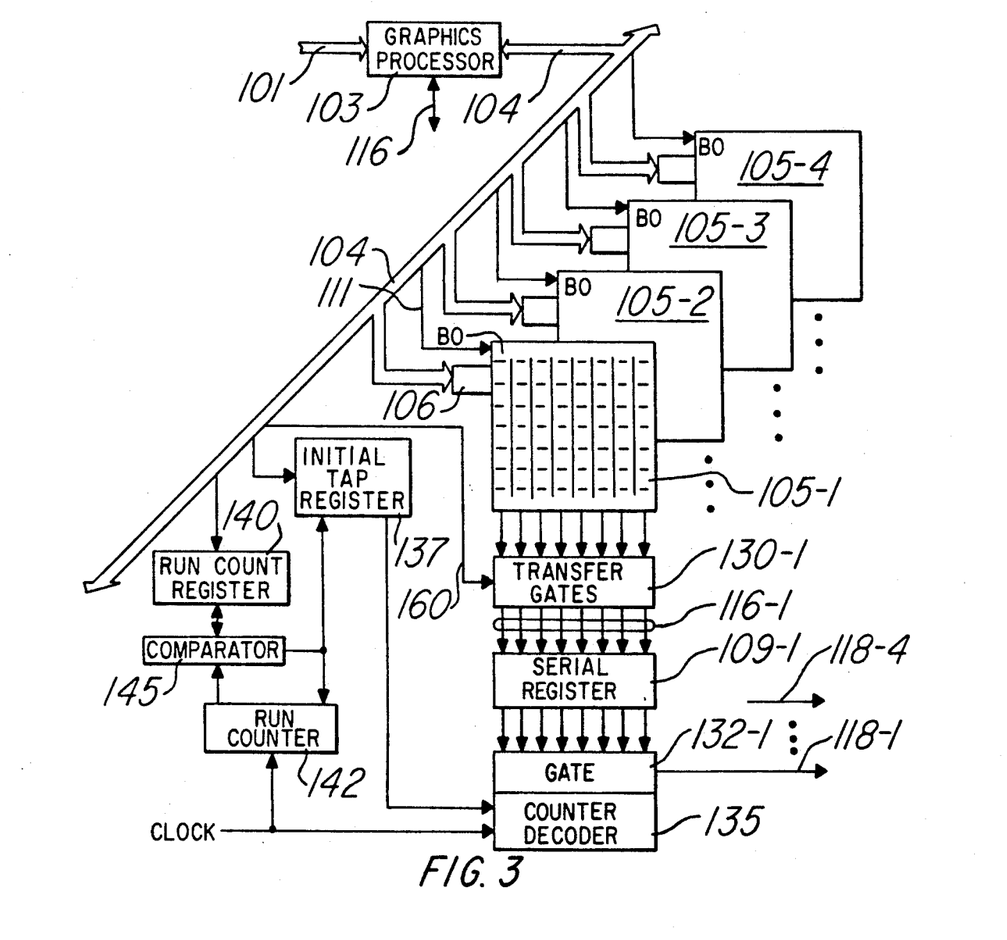
FIG. 3 is a block diagram of a random access memory system arranged with a transfer gate between the memory array and a serial register.

Referring now to FIG. 3, there is shown a more detailed block diagram of the graphics processor 103, the video random access memory 105-1, a split register 109-1, some control circuitry, and interconnecting busses and leads. Video random access memory 105 is an exemplary memory including four memory arrays 105-1, 105-2, 105-3, and 105-4 of rows and columns of storage cells. Typically the four memory arrays are included on one semiconductor chip. Information representing a single pixel for the display includes several bits of data. There is one bit, e.g., B0, stored in each of the arrays for one pixel. All of those bits for the one pixel are stored at the same row address and the same column address so that they can be either written into or read out from the whole memory in one access operation. In any specific design, there usually are as many memory arrays as there are bits in a pixel. If more than four bits are needed per pixel, either more arrays per chip or more chips may be provided.

Although the four video random access memory arrays 105-1, 105-2, 105-3, and 105-4 are shown ganged together in FIG. 3, only one of them, 105-1, will be discussed hereinafter for purposes of simplifying both the drawing and the description without compromising any generality. It is to be understood that what is shown and said about the one memory array 105-1 serial register 109-1 and control circuits also applies to the other memory arrays and associated circuits which are ganged together from one or more semiconductor chips.

The screen of the video display 112 of FIG. 1 may be organized so that there are a large number of horizontal lines each including a large number of pixels. The register 109-1 may be either a shift register or a serial register. Hereinafter the register will be described as serial register 109-1. There is only one bit per pixel in the memory array 105-1. The number of columns used in the memory array and the number of storage elements used in the serial register 109-1 are equal.

The video random access memory array 105-1 is arranged so that the data is stored as sequential bits in a single row of the memory array 105-1. Row and column address information, together with the desired display, or pixel information, is generated by the graphics processor 103.

For random access writing, the addresses are applied through the bus 104 to an address register 106 for accessing the identified row and column storage locations in the random access memory array 105-1. The display data, to be stored at each address, also is applied through the bus 104 and a lead 111 to the random access memory array 105-1. When the graphics processor develops the random access addresses and display data for an image, that data is transmitted through bus 104 and is written into the random access memory 105-1 by making a row access and thereafter accessing a selected column where data is to be stored. This enables a random access write-in operation to write data into an addressed storage location within the array.

Serial readout of data from the memory array 105-1 to the video display occurs sequentially by line of the display. As the raster scans a line of the display, the appropriate data for each pixel in the sequence is applied to the beam for projection on the display screen. The graphics processor 103 determines the order for addressing the rows of the storage cells of the memory array 105-1, the timing of the multiplexer 130-1, and the order for reading data from the storage elements of the serial register 109-1 to achieve the desired output sequence of information being forwarded to the video display 112.

Under control of the graphics processor 103, the transfer gate 130-1 determines whether and when data is read out on the bit lines of the memory array to the serial register 109-1. Once the data is stored in the serial register 109-1, bits of data can be transmitted from the serial register 109-1 out to the video display 112.

Additional control circuitry, which is common to the several memory arrays, is provided for determining the specific portion of data to be transmitted from the serial register 109-1. The data from the serial register 109-1 can be read out from a separate tap at each storage element. Conceptually, the taps are represented by a gate circuit 132-1 which receives a separate output from each storage element of the serial register 109-1. A counter decoder 135 determines which one of the serial register storage element outputs is transmitted to the video display 112 during any time slot determined by a readout clock signal CLOCK.

Since the initial pixel data to be transmitted may be in any serial register 109-1 location, the graphics processor 103 loads the address of that initial pixel data into an initial tap, or start point, register 137. Upon receipt of a reset signal from a comparator 145, the initial tap register 137 loads the initial pixel data address into the counter decoder 135 for enabling the gate circuit 132-1 to transmit the data from the correct serial register storage element. Loading of the initial pixel data address may be in parallel to the counter decoder 135.

Data read out thereafter generally proceeds sequentially along the storage elements of the serial register 109-1. The sequential addressing for reading out the data from the serial register 109-1 may be interrupted before the end of the register. Interruptions are made by the graphics processor 103 loading a number, or run count, into a run count register 140 for determining the number of sequential addresses of the serial register 109-1 that are accessed before the counter decoder 135 and gate circuit 132-1 jump to a new initial, or start, tap address for subsequent readout. The number in the count register 140 and a run count from a run counter 142 are compared by the comparator 145. When they do not match, the current sequence of addresses continues as the run counter is incremented by the signal CLOCK for each readout operation. When the two counts do agree, the comparator 145 produces a signal for resetting the run counter 142 and for loading the new initial tap address into the initial tap register 137. As a result, the counter decoder 135 enables the gate circuit 132-1 to jump to the new initial tap address of the serial register 109-1 and thereby interrupt the sequential addressing.

The graphics processor 103 of FIGS. 1 and 3 generates all of the information for the graphic display. Each bit of the data can be generated at any time and in any order. The processor 103 knows which bit is being generated at any time and where that bit is preassigned, or mapped, for storage in the random access memory 105. When randomly writing the bits into the random access memory 105, the order of writing the bits is unimportant except for efficiency considerations, but each bit must be stored in a storage element at its own preassigned, or bit mapped, location in the random access memory.

After a complete display screen of data is stored in the random access memory 105 of FIG. 1, the system can commence reading that data from the random access memory for transfer to the serial register 109-1, the data register 107 and on to the video display 112. The video display uses a well-known raster scanning technique for presenting the graphic information on a display screen or cathode ray tube. Meanwhile, the graphics processor 103 scans the random access memory 105 for transferring data to the display. Data from the memory array is transferred through the transfer gate, the serial register, the data register 107, and the color palette, and is coordinated with the raster beam as it sweeps across one horizontal line after another projecting the graphics information onto the screen at predetermined locations. The sequential order of readout of data from the memory array is fixed by the hardware and firmware of the graphics display system.

From the serial register, the data is sent to the video palette by way of the data register 107 of FIG. 1. Data register 107 is arranged to receive in parallel, the sequential data streams from each of the arrays 105-1, 105-2, 105-3, and 105-4 by way of the output leads 118-1, 118-2, 118-3, and 118-4 of FIG. 3. In operation, the data register 107 takes in the plural parallel streams of input data, and shifts them out in one interleaved sequence. All of the bits for each pixel are grouped together in the output stream of data. Thus all of the data describing each pixel is applied to the video palette at once.

The video palette translates the pixel data into the desired form for application to the digital to video converter. From the digital to video converter, the video signals are applied to the display. At the finish of each line of the screen, the raster retraces, or returns, to the beginning side of the screen, typically, one or more lines lower. During retrace, graphic information is blanked from the beam. Once the retrace is completed, the raster commences sweeping across another line of the screen and projects the graphic display information. Because the raster beam sweeps across the entire screen and then retraces, the data read from the memory array must be presented to the beam modulator of the video display 112 in the proper sequential order for each complete sweep across the screen.

Figure 4:
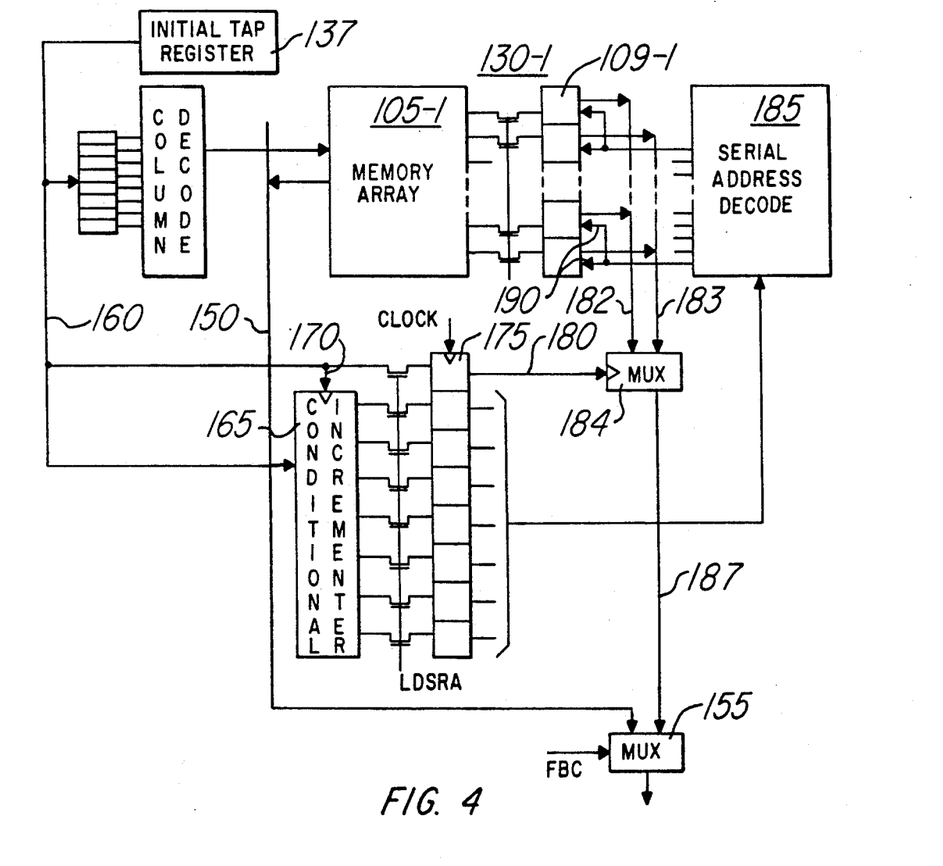
FIG. 4 is a block diagram of control circuitry for serial readout from a random access memory.

Referring now to FIG. 4, there is shown an arrangement for controlling serial access of data from the memory array 105-1. A row address is applied to the row address decoder (not shown) for enabling data to be read out of all of the cells in the row at once. Those data bits are transmitted along the bit lines of the memory array 105-1 and through the transfer gates 130-1 to be latched into the serial register 109-1. The transfer gates 130-1 are enabled by a transfer signal from the graphics processor. Once the row of data bits is stored in the stages of the serial register 109-1, a serial readout of the data bits from the serial register can be commenced.

To start a serial data readout, the initial tap address is forwarded from the graphics processor and is latched into the initial tap address register 137 and a column address buffer 138. There are sufficient bits to select one of 256 columns. Such initial tap address is decoded by a column address decoder 139 into a selected column signal that is applied to the memory array 105-1 and that enables a data bit from the addressed column and the previously addressed row to be transmitted by way of the initial bit data line 150 to an input of a first bit multiplexer 155. This data bit is accessed directly from the memory array 105-1 and is the initial, or first, data bit of the desired sequence of data bits.

The initial tap address also is applied by way of a bus 160 to a conditional parallel increment circuit 165 to generate subsequent sequential serial register addresses, or tap addresses. The least significant bit of the initial tap address is applied by way of a lead 170 to the conditional parallel increment circuit as a control bit to determine whether the initial tap address passes through the conditional parallel increment circuit unchanged or is incremented as it passes through that circuit. The resulting address is the second of the sequential serial register addresses and is to be used for accessing the second bit of the output sequence. The conditional parallel increment circuit 165 is described hereinafter with respect to FIG. 5.

A load serial register address signal LDSRA from the graphics processor enables a set of gates for passing either the unchanged address or the incremented address to the serial register address latch 175 whichever exists at the time.

The logic level of the least significant bit stored in the serial register address latch 175 is used as a control signal on a lead 180 for selecting for transmission one or the other of the two input signals being applied by way of data leads 182 and 183 to an odd/even multiplexer 184. One of the data bits from the serial register 109-1 is transmitted, as the second data bit of the desired sequence, through the odd/even multiplexer 184. If the least significant address bit, latched in the serial register address latch 175, equals one, the data bit on the odd bit data lead 182 from an odd address stage of the serial register is transmitted through the odd/even multiplexer 184 to the first bit multiplexer 155. If the least significant address bit, latched in the serial register address latch 175, equals zero, the data bit on the even bit data lead 183 from an even address stage of the serial register is transmitted through the odd/even multiplexer 155. Otherwise the data bit on the odd bit data lead 182 from the odd address stage of the serial register is transmitted through the odd/even multiplexer 155.

While stored in the serial register address latch 175, the serial register address (without the least significant bit) is decoded by a serial address decoder 185 into a one-out-of-128 code so that two taps, e.g., taps 190, are enabled simultaneously. Those enabled taps are always an even address tap and the next higher odd address tap because of the operation of the conditional increment circuit on the initial tap address. If that initial tap address is an even value, the address is not incremented and therefore remains an even address. If the initial tap address is an odd value, that address, without the least significant bit, is incremented to the next higher address.

Since the initial data bit is read out directly from the memory array 105-1, the initial tap address never is required for accessing the initial data bit from the serial register 109-1. The second tap address now is available much sooner than was possible in the prior art because the complete second tap address is available as soon as the least significant bit stage of the serial address counter 175 is incremented by a clock signal CLOCK. The increment operation does not need to ripple through the entire counter 175 and decoding circuitry 185 before the second bit can be read out. As soon as the first stage of the serial address counter 175 is incremented, the second bit, which has been available on the other input of the even/odd multiplexer 184, is transmitted through that multiplexer under selection control by the signal on the lead 180 representing the content of the least significant bit of the serial register address counter 175.

During a transfer operation, i.e., when a row of data, is transferred from the array 105-1 to the serial register 109-1 for serial readout, a first bit control signal FBC enables the first bit multiplexer 155 to transmit the first bit of the sequence existing on the initial bit data lead 150. Subsequently the level of the first bit control signal FBC changes so that the second and subsequent bits on serial data lead 187 are transmitted through an output to the data register 107 of FIG. 1.

Figure 5:
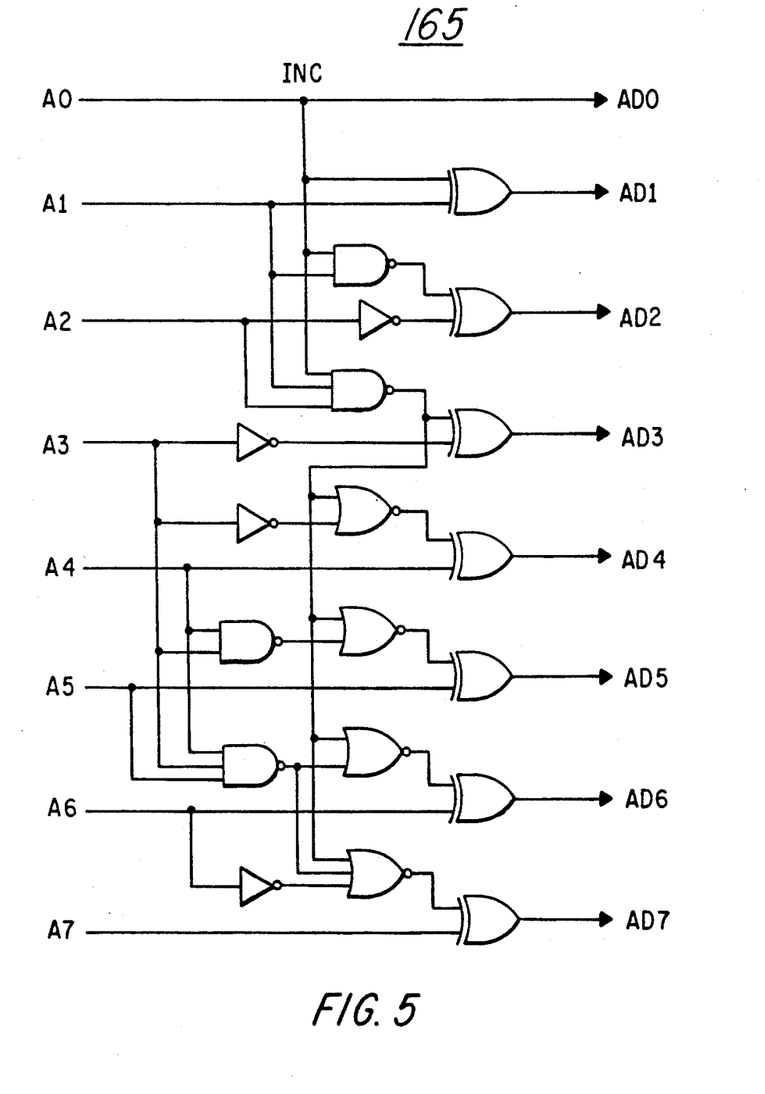
FIG. 5 is a logic schematic for a conditional parallel increment circuit.

Referring now to FIG. 5, there is shown an exemplary conditional increment circuit 165. The initial tap address is applied to input terminals A0-A7. The least significant address bit A0 has two functions. A first function of the least significant bit A0 is to pass directly through the conditional parallel increment circuit for storage as the least significant bit of the serial register address in the serial address counter 175 of FIG. 4. A second function of the least significant bit A0 is to determine whether or not to increment, in the circuit 165, the value of the remaining serial address bits A1-A7. That value of the remaining bits A1-A7 is incremented if the least significant bit A0 is equal to one and is not incremented if the least significant bit A0 equals zero.

Output bits produced on output terminals AD0-AD7 are latched into the serial address counter 175 of FIG. 4 wherein the stored address is incremented by a clock signal CLOCK.

The foregoing description presents the arrangement and operation of an illustrative example of the invention. This exemplary arrangement and other arrangements, made obvious in view thereof, are considered to be within the scope of the appended claims.

What is claimed is:

1. A random access memory comprising:
   at least one memory array including a plurality of storage cells arrange din addressable rows and columns;
   a row address decoder;
   a column address decoder;
   a serial register including a plurality of stages having taps;
   a serial register address decoder for enabling readout of data bits from sequentially addressed taps of the serial register stages;
   a serial address counter for generating and applying a sequence of tap addresses to the serial register address decoder;
   an initial bit data line connecting to the memory array;
   an odd bit data lead connecting with taps of odd address stages of the serial register;
   an even bit data lead connecting with taps of even address stages of the serial register;
   an odd/even multiplexer responsive to data bits carried from the taps of the serial register on the odd and even bit data leads for producing a sequence of other data bits from the serial register on a serial data line;
   a first bit multiplexer having a first input connecting with the initial bit data line of the memory array for reading out a first data bit from a storage cell of an initially addressed column of the memory array and having a second input connecting with the serial data line for reading out the sequence of other data bits from addressed taps of the serial register; and
   an increment circuit for either passing the initial tap address to the serial address decoder for accessing a second data bit of the sequence by way of the serial data line from the serial register to the first bit multiplexer or passing an incremented initial tap address to the serial address decoder for accessing the second data bit of the sequence by way of the serial data line from the serial register to the first bit multiplexer.

2. A random access memory, in accordance with claim 1, further comprising:
   an arrangement interconnected with the data line and the serial address counter for incrementing and passing to the serial address counter the initial tap address less its least significant bit in response to the least significant bit equalling one and for passing the unchanged initial tap address to the serial address counter in response to the least significant bit equalling zero.

3. A random access memory, in accordance with claim 2, wherein
   the serial register address decoder simultaneously accesses at least two adjacent stages of the serial register.

4. A random access memory, in accordance with claim 3, wherein
   a clock signal applied to the serial address counter increments the count stored therein.

5. A random access memory, in accordance with claim 1, wherein
   the serial register address decoder simultaneously accesses at least two adjacent stages of the serial register.

6. A random access memory, in accordance with claim 1, wherein
   a clock signal applied to the serial address counter increments the count stored therein.

7. A random access memory, in accordance with claim 1, wherein
   the increment circuit operates on all digits of the initial tap address in parallel through a combinational logic circuit.

8. A random access memory, in accordance with claim 1, wherein
the memory array is comprised of dynamic NMOS circuits; and
the row address decoder, the column address decoder, the serial address decoder, the serial register, and the multiplexer are comprised of static CMOS circuits.

9. A random access memory, in accordance with claim 1, wherein
the memory array is comprised of dynamic NMOS circuits; and
the row address decoder, the column address decoder, the serial address decoder, the serial register, and the multiplexer are comprised of static BICMOS circuits.

* * * * *